(12) United States Patent  
Subramanian et al.

(10) Patent No.: US 7,365,437 B2  
(45) Date of Patent: Apr. 29, 2008

(54) METHOD OF WET ETCHING VIAS AND ARTICLES FORMED THEREBY

(75) Inventors: Kanakasabapathi Subramanian, Clifton Park, NY (US); Jeffrey Bernard Fortin, Niskayuna, NY (US); Wei-Cheng Tian, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 98 days.

(21) Appl. No.: 11/337,249

(22) Filed: Jan. 23, 2006

(65) Prior Publication Data

US 2006/0118920 A1 Jun. 8, 2006

Related U.S. Application Data

(62) Division of application No. 10/938,247, filed on Sep. 13, 2004, now Pat. No. 7,101,789.

(51) Int. Cl.  
*H01L 29/40* (2006.01)

(52) U.S. Cl. ...................... 257/774; 257/622

(58) Field of Classification Search ............... 257/774, 257/622  
See application file for complete search history.

(56) References Cited

U.S. PATENT DOCUMENTS 5,682,062 A * 10/1997 Gaul ........................ 257/686
5,883,012 A * 3/1999 Chiou et al. ................ 438/748
5,903,045 A * 5/1999 Bertin et al. ................ 257/621
6,143,976 A * 11/2000 Endros ....................... 136/256
7,152,289 B2* 12/2006 Wang et al. ................ 29/25.35
2002/0127835 A1* 9/2002 Geusic et al. ............... 438/612

OTHER PUBLICATIONS

"Characterization of Anisotropic Etching Properties of Single-Crystal Silicon: Effects of KOH Concentration on Etching Profiles", K. Sato, et al., IEEE 1997, pp. 406-411.  
"Crystal Planes After Anisotropic Etch of (110) Material", OKMETIC, Aug. 26, 2003.  
"KOH Wet Etching Techniques for the Micromachining of (100) SOI Wafers", M.A. Rosa, et al., IEEE 1997, pp. 454-457.  
"(110) Silicon Etching for High Aspect Ratio Comb Structures", Seong-Hyok Kim, et al., IEEE 1997, pp. 248-252.

(Continued)

*Primary Examiner*—Roy Potter  
(74) *Attorney, Agent, or Firm*—William E. Powell, III; Curtis B. Brueske

(57) ABSTRACT

A method for forming smooth walled, prismatically-profiled through-wafer vias and articles formed through the method. An etch stop material is provided on a wafer, which may be a <110> silicon wafer. A mask material is provided on the etch stop material and patterned in such a way as to lead to the formation of vias that have at least one pair of opposing side walls that run parallel to a <111> plane in the wafer. A wet etchant, such as potassium hydroxide, is used to etch vias in the wafer. The use of a wet etchant leads to the formation of smooth side walls. This method allows an aspect ratio of height versus width of the vias of greater than 75 to 1.

24 Claims, 5 Drawing Sheets

OTHER PUBLICATIONS

"Fast Wet Anisotropic Etching of Si(100) and (110) With a Smooth Surface in Ultra-High Temperature KOH Solutions", Hiroshi Tanaka, et al., IEEE 2003, pp. 1675-1678.

"Meniscus Interface Etching of Silicon in KOH in a Hands-on Introductory Course in MEMS", J. Schultz, et al., IEEE 2001, pp. 153-157.

"Effects of Metallic Impurities on Anisotropic Etching of Silicon in Aqueous KOH-Solutions", A. Hein, et al., IEEE 1997, pp. 687-690.

"Microfabrication of Single-Crystal Silicon Multiple Torsional Oscillators", Michelle D. Chabot, et al., University of Texas at Austin.

* cited by examiner

US 7,365,437 B2

METHOD OF WET ETCHING VIAS AND ARTICLES FORMED THEREBY

This is a divisional application of Application No. 10/938,247, filed Sep. 13, 2004, now U.S. Pat. No. 7,101,789.

BACKGROUND

The present disclosure relates generally to the field of micromachining techniques, and more particularly relates to a method for bulk forming through-wafer vias with a wet etchant.

Wet etching of silicon wafers with potassium hydroxide (KOH) is a well-known bulk micromachining technique. Wet etching as a micromachining technique provides a lower cost of manufacturing, since the etching can be done in batch processes and there is no need for expensive etching equipment, such as plasma etchers. The use of KOH for etching silicon wafers produces smooth side walls. KOH etching of <100> silicon wafers produces pyramidal shapes, i.e., the side walls of the vias are not parallel but instead incline relative to each other. The pyramidally-shaped openings through wafers have an enlarged footprint, thus lowering the upper limit of the number of openings that can be produced in the wafers and lowering the density of vias capable of being etched in a given footprint.

BRIEF DESCRIPTION

In one exemplary embodiment, there is provided a wafer that includes a wafer substrate having opposing surfaces and at least one through-wafer via connecting the opposing surfaces having an aspect ratio between height and width of greater than 75 to 1.

In one aspect, a semiconductor device is provided having a substrate and at least one via extending into the substrate and having an aspect ratio between height and width of greater than 75 to 1.

In another exemplary embodiment, there is provided a wafer including a wafer substrate and at least one through-wafer via having a prismatic profile and a smooth side wall.

In one aspect, a semiconductor device is provided having a substrate and at least one via having a prismatic profile and a smooth side wall.

In another exemplary embodiment, there is provided a method for forming prismatically-profiled through-wafer vias. The method includes applying an etch stop material to a wafer made of silicon, masking the etch stop material, and patterning openings in the etch stop material, wherein the patterning is such that at least two opposing edges of the openings run parallel to a <111> plane within the wafer. The method further includes applying wet etchant to the openings to form prismatically-profiled through-wafer vias.

DRAWINGS

DETAILED DESCRIPTION

Figure 1:
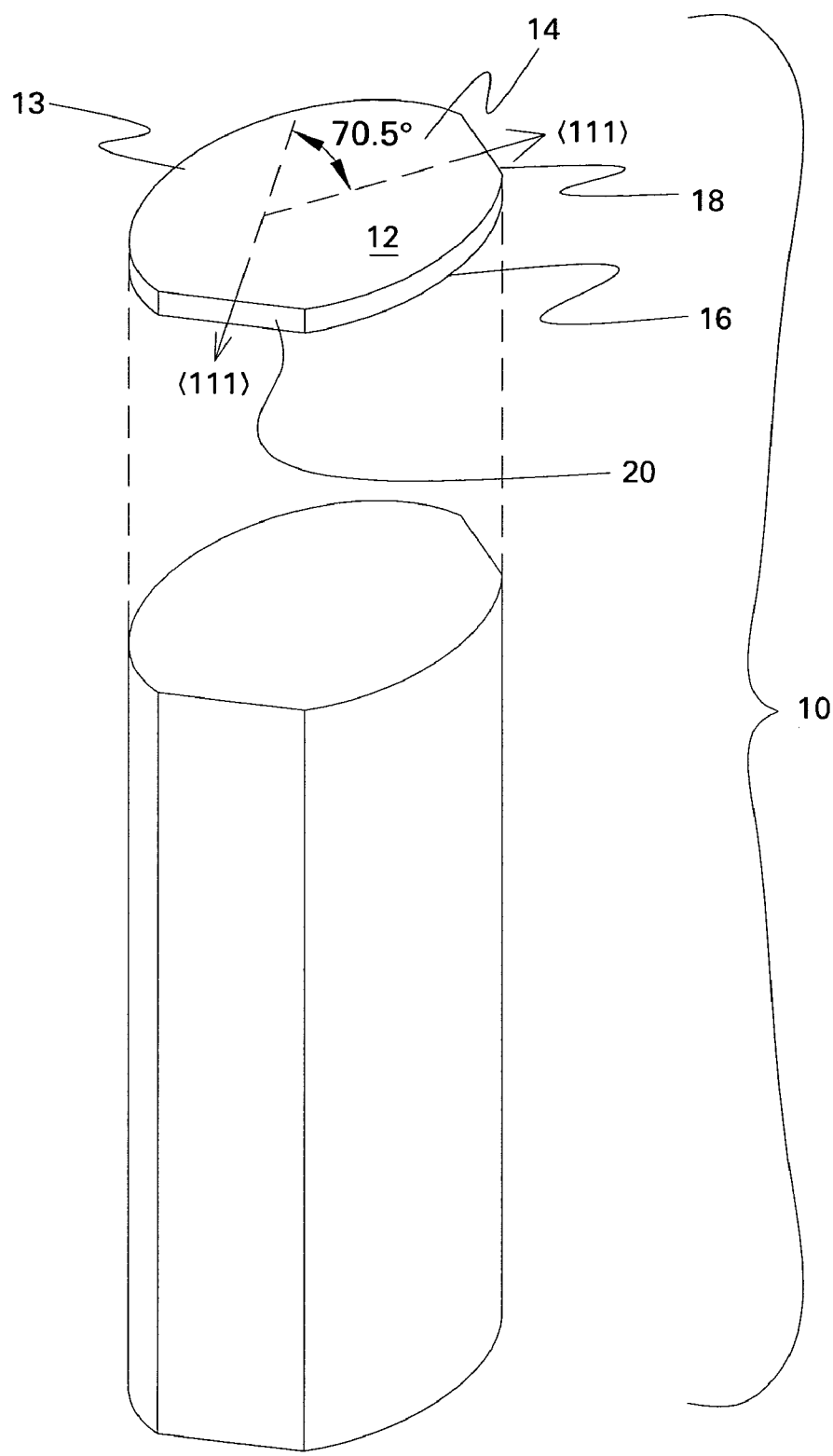
FIG. 1 is an exploded perspective view of a column of wafer material including a sliced wafer.
Figure 2:
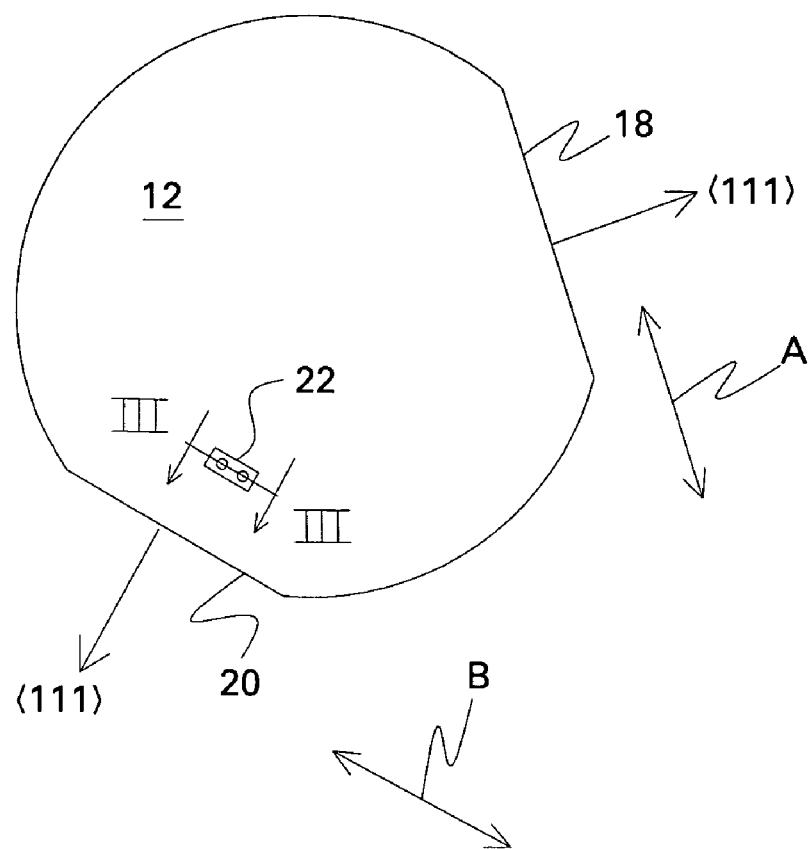
FIG. 2 is a top view of the sliced wafer of FIG. 1.
Figure 3:
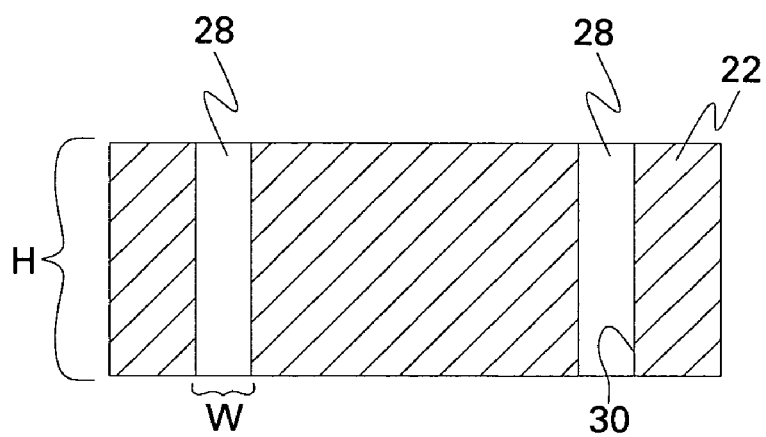
FIG. 3 is a cross-sectional view taken along line III-III of FIG. 2.

With reference to FIGS. 1-3, there is shown a <110> silicon wafer 12. A <110> silicon wafer includes two <111> planes therein. The wafer 12 is sliced from a column of wafer material 10. The illustrated wafer 12 includes a substrate 13 having opposing first and second surfaces 14 and 16. Optionally, a primary flat surface 18 and a secondary flat surface 20 may be formed on the column of wafer 10 (or on the individual wafer 12) to enable proper registration of devices, such as, for example, semiconductor or MEMS devices, that will eventually be diced out of the wafers 12. It should be appreciated that formation of the primary and secondary flat surfaces 18, 20 is optional, and only one of the flat surfaces or neither of the flat surfaces may be formed.

As shown, the primary flat surface 18 is formed such that it runs in a plane parallel to direction A (FIG. 2), which is perpendicular to one of the <111> planes in the wafer slice 12. Further, the secondary flat surface 20 runs in a direction parallel to direction B (FIG. 2), which is perpendicular to another of the <111> planes in the wafer slice 12. The two illustrated <111> planes in the wafer 12 form an angle 70.5° from each other.

Various electronic articles, such as, for example, semiconductor chips, can be formed from the wafer 12, by dicing them out of the wafer 12 and writing circuitry thereon. For illustrative purposes only, an area 22 is shown on the wafer 12. The area 22 is but one of numerous areas to be diced from the wafer 12. It should be appreciated that the size of area 22 is exaggerated in FIG. 2 for ease of illustration.

Certain devices that can be formed on areas, such as area 22, may require the formation of through-wafer vias to connect circuitry on opposing surfaces of the wafer. Examples of such devices include semiconductor chips. Other devices that can be formed on areas, such as area 22, may require the formation of through-wafer vias as mechanical or fluidic interconnects, such as MEMS devices such as pressure sensors, gas sensors, and microfluidic devices. With specific reference to FIG. 3, through-wafer vias 28 are shown extending from surface 14 to surface 16 in semiconductor area 22. Each through-wafer via 28 has a plurality of side walls 30. Through-wafer vias 28 have a height H the distance between the surfaces 14 and 16 and a width W between opposing side walls 30. By properly orienting the masking for semiconductor area 22 of a <110> wafer slice 12 parallel to directions A and/or B, a wet etchant, such as KOH, can be used to form the prismatically-shaped through-wafer vias 28, thereby allowing the width W to remain constant throughout the height H of the through-wafer vias 28.

Although prismatically-shaped through-wafer vias can be formed with a dry etchant, there are disadvantages to using a dry etchant. Dry etchant cannot be used to produce through-wafer vias in batch, but instead do so serially. Further, dry etching involves expensive equipment and the need for process gases. Also, the side walls, such as side wall 30, formed with a dry etchant are rougher than those formed by a wet etchant. Specifically, side walls formed with a wet etchant, such as KOH, have a mirror-like finish, with roughness on the order of only a few nanometers.

Figure 4A:
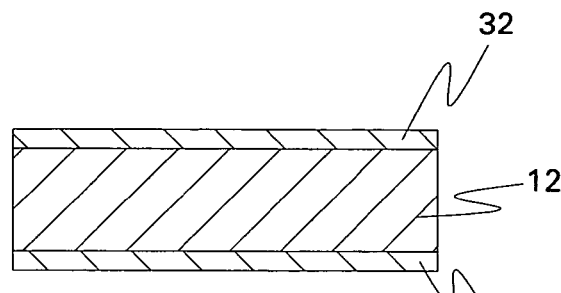
FIGS. 4a-4d are exemplary depictions of processing steps for forming a through-wafer via in accordance with an exemplary embodiment of the invention.
Figure 4B:
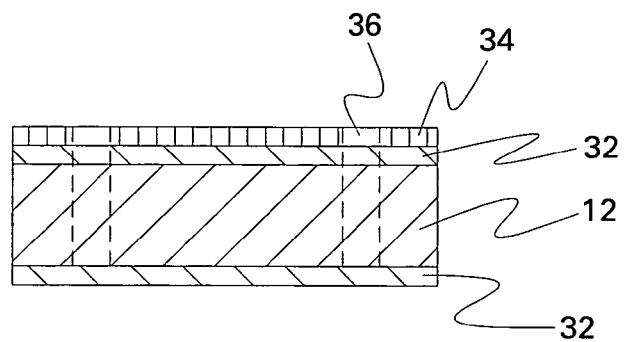

With specific reference to FIGS. 4a through 5, next will be described a process for forming through-wafer vias 28. The wafer 12 is coated on its surfaces with an etch stop material 32 at Step 100 (FIGS. 4a, 5). The etch stop material 32 should include a material that is insensitive to the wet etchant. For example, if the wet etchant is KOH, silicon nitride (SiN), silicon carbide (SiC), or various oxide materials, such as silicon dioxide ($SiO_2$) may be utilized as the etch stop material 32. At Step 105, a mask material 34 is applied to the etch stop material 32 (FIGS. 4b, 5). Any suitable masking technique may be used. For example, photo-resist material may be used, or alternatively, a shadow mask may be used as a mask and as a substitute for the etch stop material 32 itself.

At Step 110, openings 36 are patterned in the etch stop material 32 (FIGS. 4b, 5). The mask material 34 may be a photo-resist material. For a positive photo-resist material, the photo-resist material is developed and the etch stop material 32 beneath the exposed portion of photo-resist material is patterned. Conversely, for a negative photo-resist material, the photo-resist material is developed and the etch stop material 32 beneath the unexposed portion of photo-resist material is patterned. Alternative ways to pattern openings 36 may include using a laser according to a predetermined pattern, or using a shadow mask or a stencil formed of a material not sensitive to KOH as the mask material 34.

Figure 6:
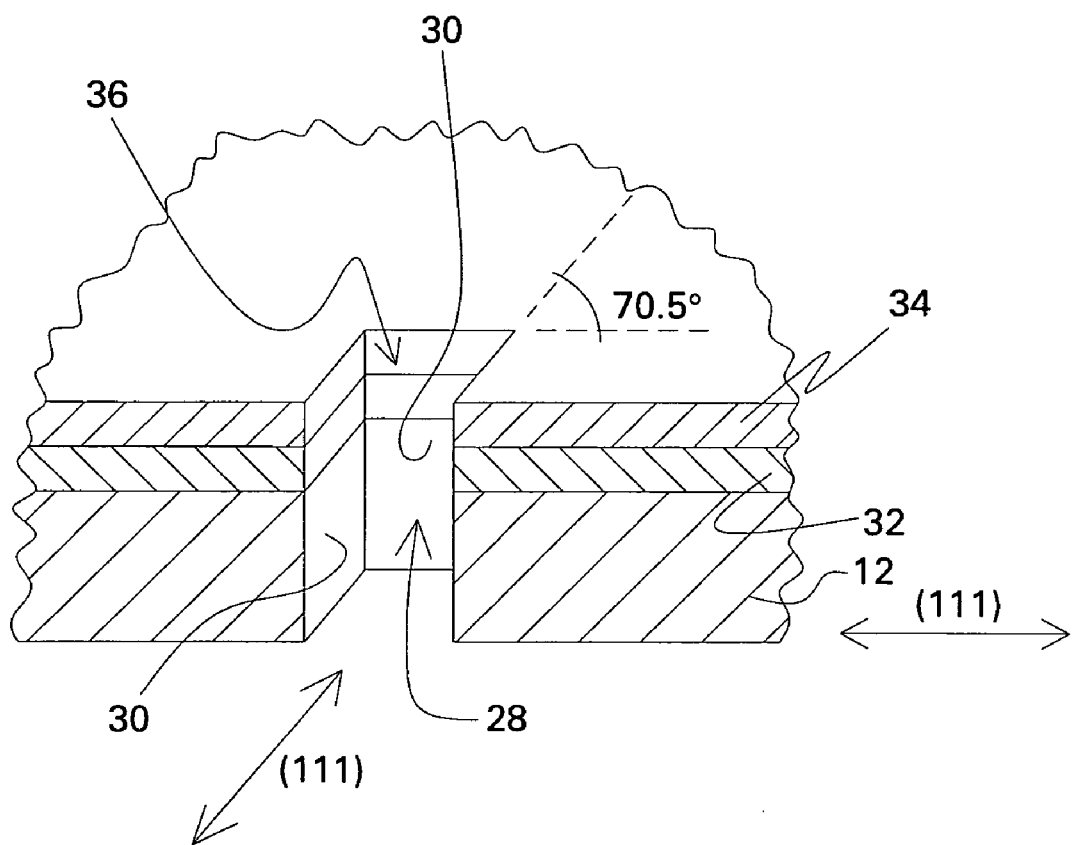
FIG. 6 is a partial perspective view illustrating the prismatic profile of a through-wafer via formed through the process steps of FIG. 5.

The openings 36 are patterned such that the vias 28 to be formed in a later step have a prismatic profile. As illustrated in FIG. 6, the mask material 34 should be patterned such that the edges of the openings 36 run parallel with at least one of the <111> planes within the wafer 12. This will ensure that the vias 28 later formed have a prismatic profile having at least two side walls 30 that are parallel to a <111> plane within the wafer 12. As shown in FIG. 6, the via 28 has four side walls 30, one pair parallel to a <111> plane and the other pair parallel to another <111> plane and at a 70.5° angle to the first pair. The mask material 34 is shown on the wafer 12 including the via 28 merely to illustrate how the patterning of the mask material 34 should be accomplished. It is to be understood that in practice the mask material 34 is removed prior to the formation of the vias 28.

Figure 4C:
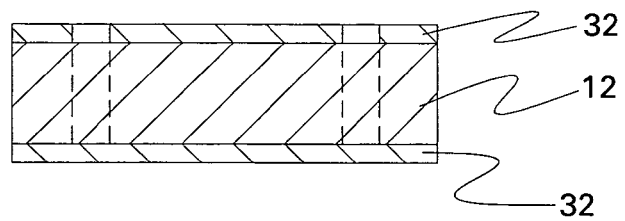
Figure 4D:
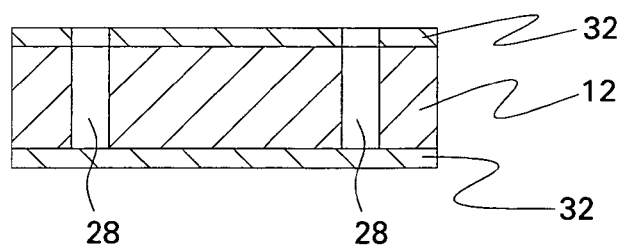
Figure 5:
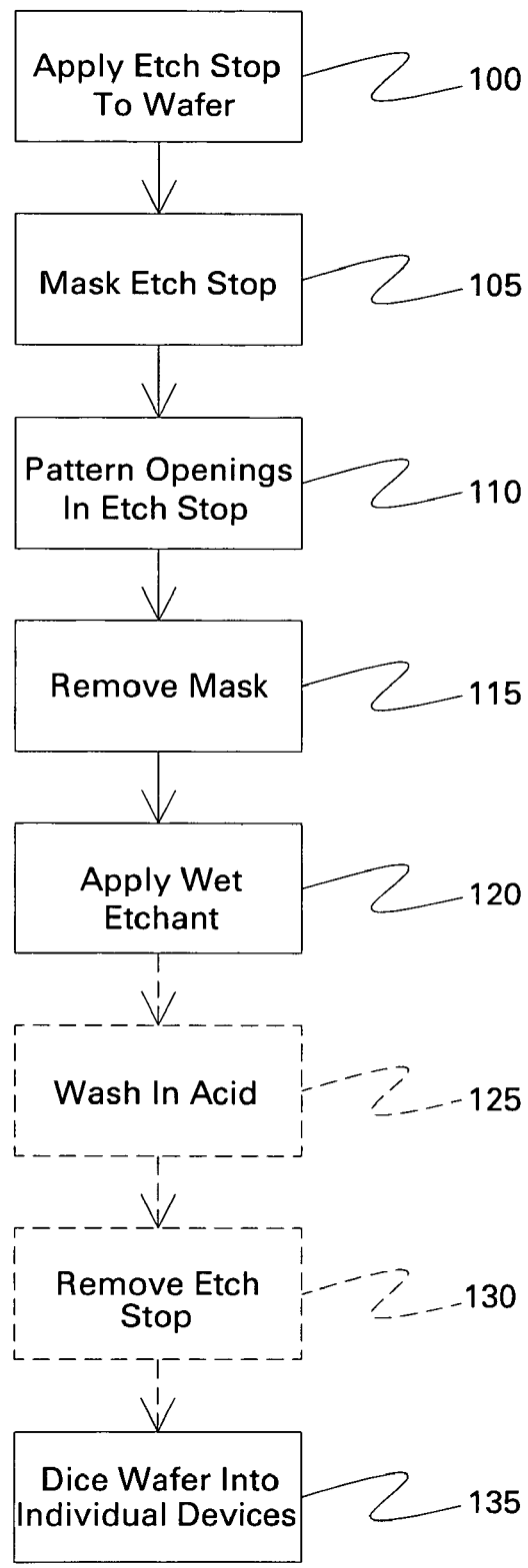
FIG. 5 illustrates steps for forming a through-wafer via in accordance with an exemplary embodiment of the invention.

At Step 115, the mask material 34 is removed, leaving openings 36 in the etch stop material 32 (FIGS. 4c, 5). After removal of the mask material 34, a wet etchant, such as KOH, is applied to the wafer 12 at Step 120. The application of the KOH may be accomplished in any suitable way, such as, for example, dipping the wafer 12 into the KOH. Due to the orientation of the patterning on the etch stop material 32, the KOH forms through-wafer vias 28 (FIGS. 4d, 5) having a prismatic profile. The prismatic profile ensures that a greater number of through-wafer vias 28 may be formed on any given wafer 12. The etching of patterns aligned to the <111> plane on <110> oriented wafers gives rise to a sidewall facet at the bottom of the via 28. The facet may be etched away by over-etching with KOH or by performing a short backside etch. Finally, at Step 135, the wafer 12 is diced into individual devices, such as, for example, semiconductor chips or pressure sensors.

Some optional steps may be incorporated into the method for forming through-wafer vias prior to the dicing Step 135. Specifically, at Step 125, the wafer 12 may be washed in a material to remove the KOH, such as, for example, water or an acid. Further, at Step 130, the etch stop material 32 may be removed from both surfaces 14, 16 of the wafer 12. And obviously, prior to Step 135, any necessary circuitry printing and filling of the vias 28 with a conductive material may be performed.

An advantage to forming through-wafer vias, with a wet etchant, having a prismatic profile is a greatly enhanced aspect ratio between the height H of the vias and the width W of the vias as compared with the aspect ratio possible through the use of a dry etchant. For example, while the use of dry etchant in special cases with carefully tailored recipes may lead to the formation of through-wafer vias having an aspect ratio (H/W) of 75:1, the use of wet etchant may provide an aspect ratio of greater than 75:1, and upwards of between about 100:1 and 250:1. Thus, through-wafer vias can be formed through embodiments of the invention having a smaller footprint than other known processes. Through-wafer vias having a smaller footprint translates into the ability to form greater numbers of such interconnects on a wafer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while embodiments of the invention have been described with reference to the formation of vertical, prismatic vias in a <110> wafer, it should be appreciated that any crystalline material, including wafers with other than a <110> orientation, with a suitable crystal orientation-dependent etch may be used in the formation of vertical, prismatic vias. Further, it should be appreciated that ascertaining <111> planes is simpler in <110> wafers, but can be done in wafers having other than <110> orientations by using the etch rate differential between crystal planes to etch vertical vias. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A <110> silicon wafer, comprising:
   a wafer substrate having opposing surfaces; and
   at least one though-wafer via connecting said opposing surfaces having an aspect ratio between height and width of greater than 75 to 1 and less than 300 to 1.

2. The wafer of claim 1, wherein the aspect ratio between height and width is between about 100 to 1 and 250 to 1.

3. The wafer of claim 1, wherein said wafer substrate includes a primary flat surface.

4. The wafer of claim 3, wherein said wafer substrate includes a secondary flat surface.

5. A <110> silicon wafer, comprising:
   a wafer substrate having opposing surfaces; and
   at least one though-wafer via connecting said opposing surfaces having an aspect ratio between height and width of greater than 75 to 1 and less than 300 to 1, wherein at least one pair of side walls of said though-wafer via run parallel to a <111> plane in the wafer.

6. The <110> silicon wafer of claim 5, wherein the aspect ratio between height and width is between about 100 to 1 and 250 to 1.

7. The <110> silicon wafer of claim 5, wherein said wafer substrate includes a primary flat surface.

8. The <110> silicon wafer of claim 7, wherein said wafer substrate includes a secondary flat surface.

9. A <110> silicon wafer, comprising:
   a wafer substrate; and at least one though-wafer via having a prismatic profile and a smooth side wall, wherein an aspect ratio between a height and a width of the though-wafer via is greater than 75 to 1 and less than about 250 to 1.

10. The wafer of claim 9, wherein at least one pair of side walls of said though-wafer via run parallel to a <111> plane in the wafer.

11. The wafer of claim 9, wherein two pairs of side walls of said though-wafer via run parallel to a <111> plane in the wafer.

12. The wafer of claim 9, wherein said wafer substrate includes a primary flat surface.

13. The wafer of claim 12, wherein said wafer substrate includes a secondary flat surface.

14. A device formed from a wafer, comprising:
a substrate comprising silicon; and
at least one via extending into said substrate and having an aspect ratio between height and width of greater than 75 to 1 and less than 300 to 1, wherein at least one pair of side walls of said via run parallel to a <111> plane in the substrate.

15. The device of claim 14, wherein the aspect ratio between height and width is between about 100 to 1 and 250 to 1.

16. The device of claim 14, wherein the semiconductor device comprises a semiconductor chip.

17. The device of claim 14, wherein the semiconductor device comprises a pressure sensor.

18. The device of claim 14, wherein the semiconductor device comprises a microfluidic device.

19. A device formed from a wafer, comprising:
a substrate comprising silicon; and
at least one via having a prismatic profile and a smooth side wall, wherein at least one pair of side walls of said via run parallel to a <111> plane in the substrate, wherein an aspect ratio between a height and a width of the via is greater than 75 to 1 and less than about 250 to 1.

20. The device of claim 19, wherein two pairs of side walls of said via run parallel to a <111> plane in the substrate.

21. The device of claim 19, wherein the semiconductor device comprises a semiconductor chip.

22. The device of claim 19, wherein the semiconductor device comprises a pressure sensor.

23. The device of claim 19, wherein the semiconductor device comprises a microfluidic device.

24. A wafer, comprising:
a wafer substrate having opposing surfaces; and
at least one though-wafer via connecting said opposing surfaces having an aspect ratio between height and width of greater than 75 to 1 and less than 95 to 1.

* * * * *

UNITED STATES PATENT AND TRADEMARK OFFICE
CERTIFICATE OF CORRECTION

| | | |
|---|---|---|
| PATENT NO. | : 7,365,437 B2 | Page 1 of 1 |
| APPLICATION NO. | : 11/337249 | |
| DATED | : April 29, 2008 | |
| INVENTOR(S) | : Kanakasabapathi Subramanian et al. | |

It is certified that error appears in the above-identified patent and that said Letters Patent is hereby corrected as shown below:

Claim 1, line 3, change "though-wafer" to -- through-wafer --;

Claim 5, line 3, change "though-wafer" to -- through-wafer --;

Claim 9, line 3, change "though-wafer" to -- through-wafer --;

Claim 10, line 2, change "though-wafer" to -- through-wafer --;

Claim 11, line 2, change "though-wafer" to -- through-wafer --;

Claim 24, line 3, change "though-wafer" to -- through-wafer --.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,365,437 B2 | Page 1 of 1 |
| APPLICATION NO. | : 11/337249 | |
| DATED | : April 29, 2008 | |
| INVENTOR(S) | : Kanakasabapathi Subramanian et al. | |

It is certified that error appears in the above-identified patent and that said Letters Patent is hereby corrected as shown below:

Column 4, Claim 1, line 42, change "though-wafer" to -- through-wafer --;

Column 4, Claim 5, line 54, change "though-wafer" to -- through-wafer --;

Column 5, Claim 9, line 1, change "though-wafer" to -- through-wafer --;

Column 5, Claim 10, line 6, change "though-wafer" to -- through-wafer --;

Column 5, Claim 11, line 9, change "though-wafer" to -- through-wafer --;

Column 6, Claim 24, line 24, change "though-wafer" to -- through-wafer --.

This certificate supersedes the Certificate of Correction issued August 12, 2008.

Signed and Sealed this

Sixteenth Day of September, 2008

JON W. DUDAS
*Director of the United States Patent and Trademark Office*